United States Patent [19]

Doernberg et al.

[11] Patent Number: 4,742,330
[45] Date of Patent: May 3, 1988

[54] FLASH A/D CONVERTER USING CAPACITOR ARRAYS

[75] Inventors: Joey Doernberg, Berkeley; Paul R. Gray, Orinda; David A. Hodges, Berkeley, all of Calif.

[73] Assignee: The Regents of the University of California, Berkeley, Calif.

[21] Appl. No.: 45,349

[22] Filed: May 1, 1987

[51] Int. Cl.$^4$ .............................................. H03M 1/12
[52] U.S. Cl. ...................... 340/347 AD; 340/347 DA
[58] Field of Search ................ 340/347 AD, 347 DA, 340/347 CC

[56] References Cited

U.S. PATENT DOCUMENTS

| | | | |
|---|---|---|---|
| 3,594,782 | 7/1971 | Carrey | 340/347 DA |
| 4,200,863 | 4/1980 | Hodges et al. | 340/347 AD |
| 4,399,426 | 8/1983 | Tan | 340/347 DA |

OTHER PUBLICATIONS

All–MOS Charge Redistribution Analog-To-Digital Conversion Techniques—Part 1, James L. McCreary, Dec. 1975.
High–Resolution A/D conversion in MOS/LSI, Bahram Fotouhi and David A. Hodges, Dec. 1979.

Primary Examiner—Charles D. Miller
Attorney, Agent, or Firm—Townsend & Townsend

[57] ABSTRACT

A flash ADC that utilizes parallel weighted capacitive arrays and a resistor string to provide reference voltage intervals and an encoder for indicating the reference voltage interval wherein an input voltage lies. For an embodiment having N branches, the reference voltage intervals are subdivided into N sub-intervals and each succeeding clock cycle.

11 Claims, 9 Drawing Sheets

FLASH A/D CONVERTER USING CAPACITOR ARRAYS

ACKNOWLEDGEMENT OF GOVERNMENT SUPPORT

This invention was made with government support under Grant No. ECS-83-10442 awarded by the National Science Foundation. The government has certain rights in this invention.

BACKGROUND OF THE INVENTION

The present invention relates generally to analog-to-digital converters (ADCs) and, more particularly, to an ADC that utilizes a weighted capacitor array.

An ADC utilizing a weighted capacitor array is disclosed in U.S. Pat. No. 4,200,863 to Hodges, et al. In that patent, the upper plates of the capacitor array are coupled to a common node and charged to $-V_{in}$. The lower plates of each capacitor in the array are coupled to either a first or second reference voltage by an ordered set of code switches. The code switches are set to various binary states by a successive approximation control logic until the voltage at the common node is nulled. The state of the code switches when the voltage level at the common node is nulled indicates the digital representation of the voltage level $V_{in}$.

As illustrated in FIG. 3 of that patent, six clock cycles may be utilized during the successive approximation technique to generate the digital representation of $V_{in}$. Further, in the embodiment depicted in FIG. 17 of that patent, a resistor string digital to analog converter (DAC) is utilized to subdivide the second reference voltage into a set of reference voltage levels. Again, a successive approximation technique is utilized to determine the reference voltage level that approximates the $V_{in}$ signal.

The embodiment depicted in the above-described patent may be fabricated utilizing all MOS techniques. Thus, cost is reduced and yield is increased compared to conventional conversion techniques.

However, the successive approximation technique for dividing the second reference voltage and setting the digital codes of the code switches takes several clock cycles. Thus, this embodiment may not be fast enough for use in video, or other systems, requiring conversion at MHz frequencies.

SUMMARY OF THE INVENTION

The present invention is an ADC that utilizes $2^N$ parallel weighted capacitor arrays to provide N bits of a digital representation of an input signal each clock cycle. In one embodiment, a 2N bit representation is generated in 2 clock cycles and in alternate embodiment a 3N bit representation is generated in 3 clock cycles.

In a preferred embodiment, each parallel array includes a set of binary weighted digit capacitors and a scaling capacitor. All the capacitors in a branch include a common plate, coupled to a common node of the branch, and an opposite plate.

According to one aspect of the invention, the opposite plates of the digit capacitors in the array are selectively coupled to various voltage levels by corresponding controllable switches. The switches select between two voltages under control of a binary signal, $b_{ij}$, where the index i identifies the digit capacitor and the index j identifies the parallel branch. The signals are provided to each branch in the form of a binary code, $(b_{N-1,j}, b_{N-2,j} \ldots b_{oj})$.

According to a further aspect of the invention, the common node is charged $-V_{in}$. Subsequently the opposite plates are coupled to a set of reference voltage levels, the define a set of reference voltage intervals to generate a first set of common node voltage levels. An encoder receives these voltage levels and generates an indication of a given reference voltage interval where $V_{in}$ lies.

According to one aspect of the invention, this indication is a binary code forming the upper N bits of the digital representation of $V_{in}$.

According to a further aspect of the invention, the given reference voltage interval is subdivided into incremental-subintervals and an indication of the subinterval wherein $V_{in}$ lies is generated in the form of a binary code. This binary code is the next N bits of the digital representation of $V_{in}$.

According to another aspect of the invention, the incremental sub-intervals are further subdivided and the lowest N bits of the digital code for $V_{in}$ are generated.

In one embodiment, the common node voltage levels are coupled to a comparator circuit in each parallel branch. According to one aspect of the invention, the encoder compensates for possible errors in the output signals from these comparators.

In one embodiment, these comparators are novel circuits that do not require common mode feedback.

According to a further aspect of the invention, an offset capacitor couples the common node to the comparator input port to compensate for comparator offset.

Other features and advantages of the invention will be apparent from the following detailed description.

DETAILED DESCRIPTION OF THE PREFERRED EMBODIMENTS

Figure 1:
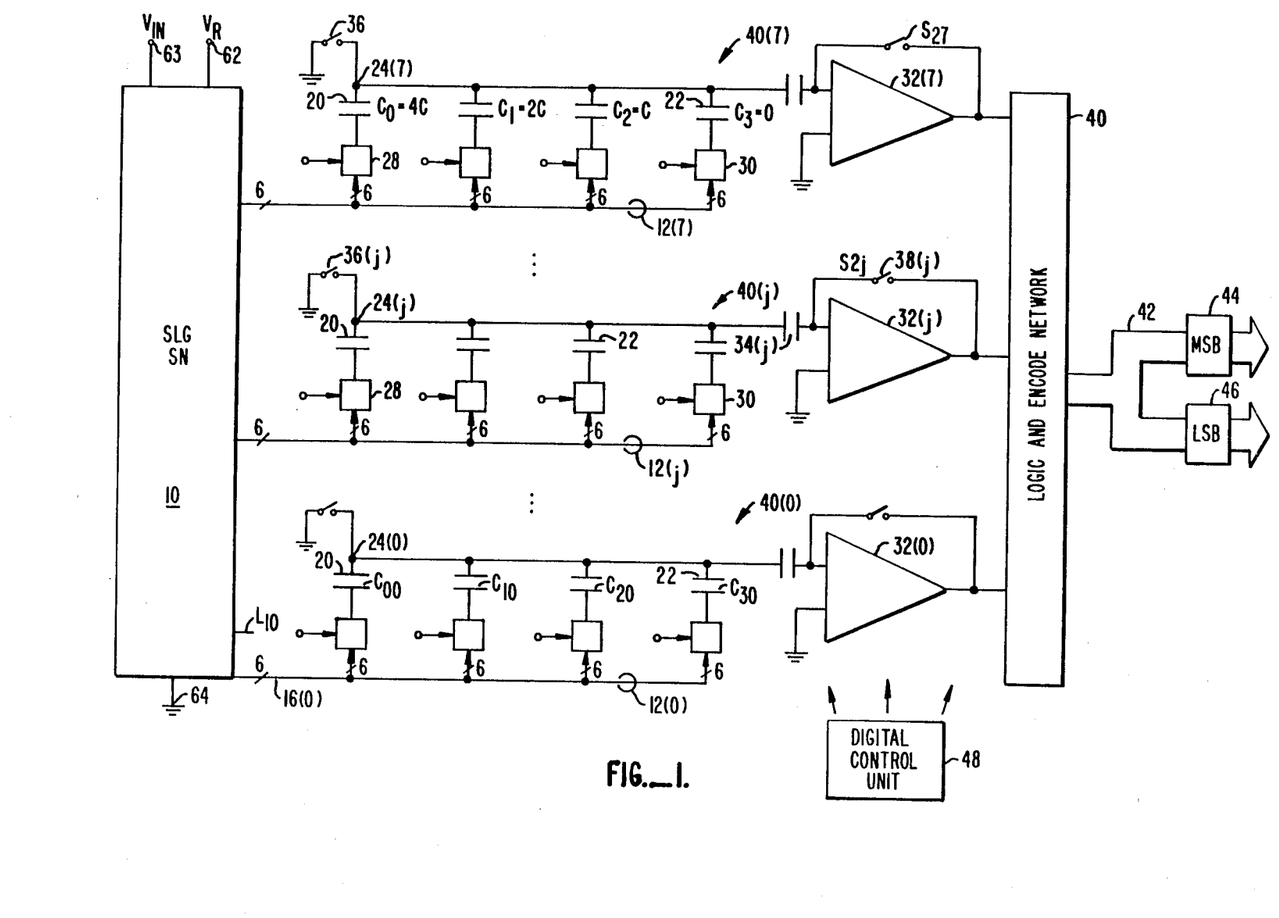
FIG. 1 is a schematic diagram of an embodiment of the invention.

FIG. 1 is a schematic diagram of a preferred embodiment of the invention. Referring now to FIG. 1, a signal level generator and switching network 10 has input ports adapted to receive a first reference voltage, a second voltage reference, $V_R$, and an analog signal, $V_{in}$. The signal level generator and switching network (SLGSN) 10 has output ports coupled to $2^N$ output buses 12(j).

The present system is a parallel system that includes ordered sets of various circuit elements. The index j indicates the place of a particular circuit element in an ordered set. To facilitate the description of the invention, an embodiment where N is 3 and $2^N$ is 8 will be described without loss of generality. Thus, $j=0, 1, \ldots, 6, 7$. Further, the first reference voltage is designated as ground or 0 volts.

Each output bus 12(j) is a six line bus that is described in greater detail below.

The circuit includes eight capacitor arrays 18, including three digit capacitors 20 and one scaling capacitor 22. The scaling capacitor has a capacitance of value C and the digit capacitors. $C_O$, $C_1$, $C_2$, have capacitive values of 4C, 2C, and C. Each capacitor has a common plate, connected to a common node 24, and an opposite plate.

The digit capacitors 20 and scaling capacitor 22 in each array 18 are coupled to the output buses 12 by a set of digit switches 28 associated with each capacitor 27. Each switch 28 has a control input port 29 for receiving a control signal. The switch couples the opposite plate of its associated capacitor 20 to one of the lines of the bus 12g as determined by a control code received at control input 29.

The common node 24 of each capacitor array 18(j) is coupled to the first input port of a respective comparator 32(j) by an offset capacitor 34(j). Additionally, each common node is coupled to ground by a switch S1 36. The second input terminal of each comparator 32(j) is coupled to ground and the output port of each comparator 32(j) is coupled to the first input port of the comparator by switch S2 38. Additionally, the output port of each comparator 32(j) is coupled to the input ports of a logic and encoder network 40. The output port of the logic and decoder network is coupled to an output bus 42 with the output bus 42 coupled to the input ports of an MSB register 44 and an LSB register 46.

In FIG. 1, each capacitor array 18, set of digit switches 28, output bus 12, offset capacitor 34, and comparator 32, form a parallel branch 18(j) of the overall parallel system. The index j indicates the place of the parallel branch in the overall parallel system and of all other components labeled by the index j. Referring by way of example to the first parallel branch 18(o), the three digit capacitors are labeled $C_{00}$, $C_{10}$, $C_{20}$, and $C_{30}$, for the index $j=0$.

Figure 1A:
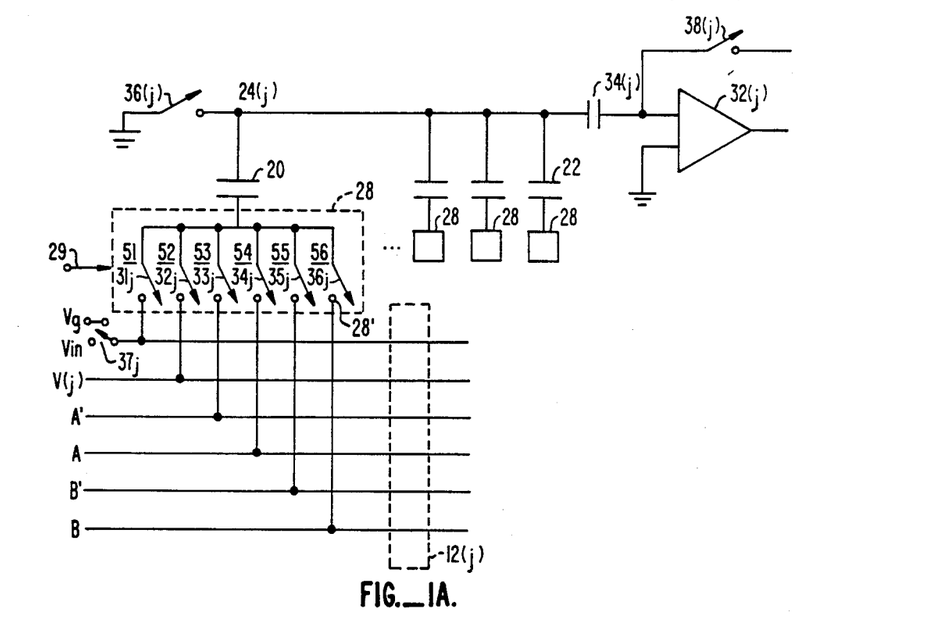
FIG. 1A is a detailed schematic of the bus and switching network.

FIG. 1A is a more detailed depiction of the output bus 12 and switch 28. Referring now to FIG. 1A, the bus 12 includes six lines labelled $V_{in}$, V(j), A', A, B', and B. The control code received at control port 29 closes one of the contacts 28' to couple the opposite plate of capacitor 20 to a selected bus line. These control codes, and other timing and control signals, are generated by a digital control unit 48. Switch $37_j$ controllably couples the $V_{in}$ line to either $V_G$(ground) or $V_{in}$.

In a preferred embodiment, the contacts 28' of switch 28 are MOS transistors. A simple decoder circuit (not shown) receives a 3-bit control code generated by the controller 48 and generates a gating signal to activate the selected MOS transistor 28'.

The controller 48 and decoding and interconnect circuitry is standard and is not part of the invention.

FIG. 3 is a schematic diagram of SLGN 10 which includes a resistor string having nine terminals, $V_0$-$V_8$. If the voltage drop across each resistor is $\Delta=V_R/8$, then the voltage level at $V_j$ is jx $\Delta$.

Figure 3A:
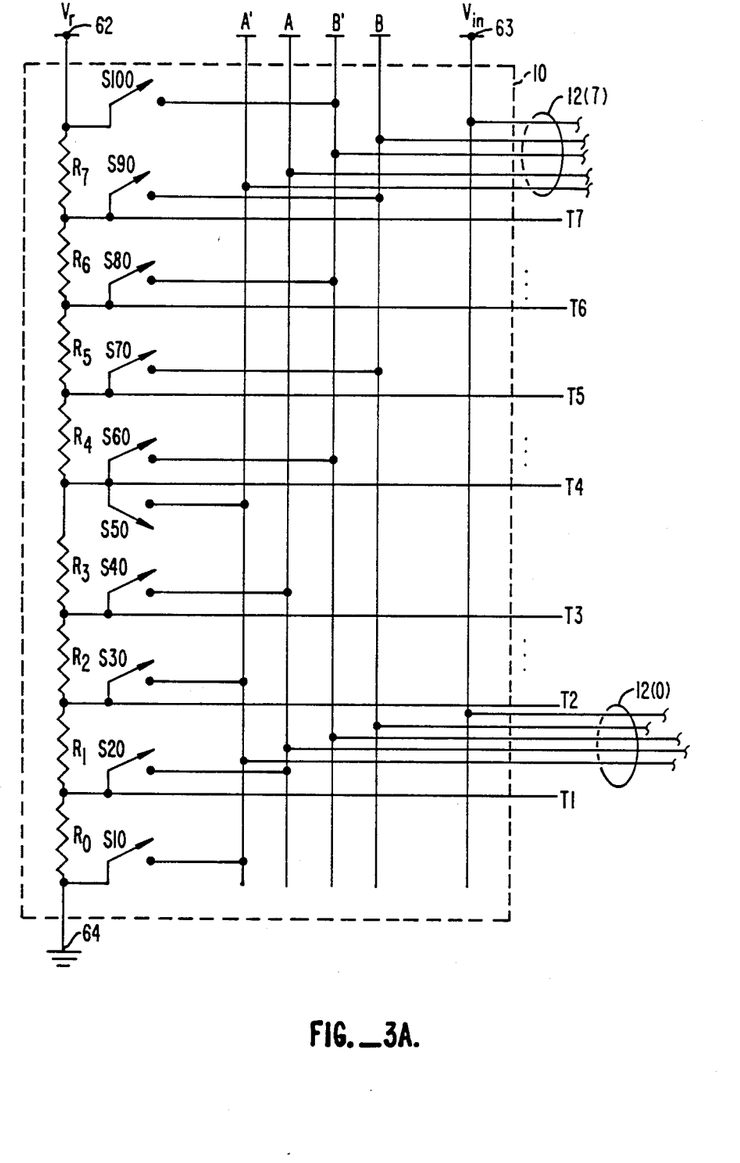
FIG. 3A is a schematic diagram of the signal level generator and switching network.
Figure 3B:
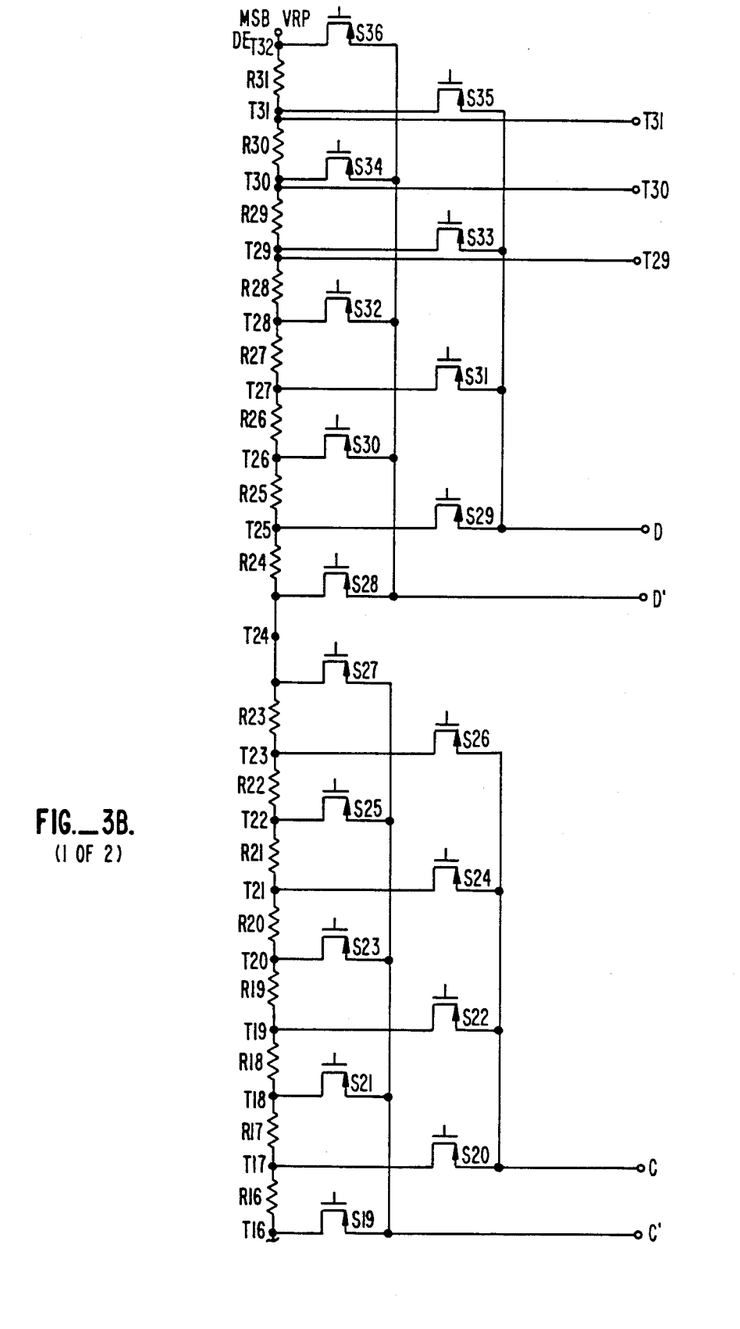
FIG. 3B is a schematic diagram of a switching circuit for a 5-bit system.

The $V_{in}$ terminal 63 is directly coupled to the $V_{in}$ line of each bus 12j.

The voltage at terminal $V_4$ is equal to $V_R/2$. The terminals $V_j$, $j \geq 4$, are selectively coupled to lines B and B' of bus 12j by switches $S_{60}$-$S_{100}$ with $V_j$, j even, output on line B', and $V_j$, j odd, output on line B. Similarly, for terminals $V_j$, $j \leq 4$, are selectively coupled to lines A' and A by switches $S_{10}$-$S_{50}$ with $V_j$, j even, output on line A' and $V_j$, j odd, output on line A. The switches $S_{jO}$, j even, for a set of even switches and the switches $S_{jO}$, j odd, form a set of odd switches.

The taplines, $T_1$-$T_7$, are directly coupled to respective terminals $V_1$-$V_7$.

In the present embodiment the level of the signal to be converted, $V_{in}$, is to be represented by a six-bit digital signal. The SLGSN 10 divides the second reference signal, $V_R$, into eight equally divided levels. The level that most closely approximates $V_{in}$ and is less than $V_{in}$ is determined in one clock cycle. The identity of this level is labeled as $V_n$, where n is a three-bit binary number which functions as the three most significant bits (MSBs) of the digital representation of the unknown input signal $V_{in}$. These MSBs are determined in one clock cycle. The MSBs indicate that the level of $V_{in}$ is between $V_n$ and $V_{n+1}$. Next, the interval between $V_n$ and $V_{n+1}$ is divided into eight equal sublevels and the sublevel that most closely approximates $V_{in}$ and is less than $V_{in}$ is determined. The three bit binary number identifying this sublevel then functions as the three least significant bits (LSBs) of the six-bit digital representation of the unknown signal $V_{in}$.

A more detailed description of the determination of the MSBs will now be provided. First, the level of the input signal, $V_{in}$, must be sampled and held on each capacitor array 18(j) of all the parallel branches 40(j). The $V_{in}$ line of each bus 12(j) is coupled to the opposite plates of capacitors 20 and 22 by switches 28. Simultaneously, the switch $S_1$ 36 is closed so that the common node 24 is coupled to ground.

Accordingly, the voltage difference across each capacitor is equal to $V_{in}$ and the upper plates of the capacitors in each parallel branch store a total initial charge equal to $-8CV_{in}$. The switches 36(j) are then opened and all the digit and scaling switches 26 and 30 are opened so that the initial charge is held on the common plates of the capacitors in each parallel branch 40(j).

Figure 2:
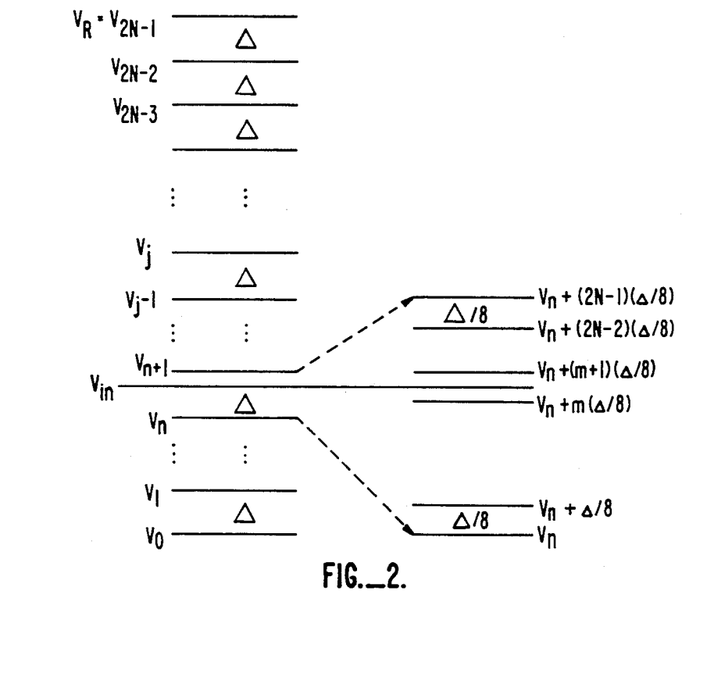
FIG. 2 is a schematic diagram illustrating the division of the reference voltage into levels and sublevels.

Secondly, the switches 28 couple the opposite plates of the capacitors in array 18 to the $V_j$ line in bus 12j. These voltage levels are depicted in FIG. 2. Each level, $V_j$, is separated from its adjacent level by a voltage interval, $\Delta$ which in this case is equal to $V_R/8$.

As described above, the initial charge stored on the common plates of the capacitors in each parallel branch 40 is equal to $-8CV_{in}$. This charge is held on the common plates of the capacitors during the entire conversion process. When the capacitor arrays 18 are coupled to the V(j) lines, the voltage level at the jth common node, $VCN_j$, is $VCN_j = (-V_{in} + V_j) = j\Delta - V_{in}$. Thus, the voltage level at the common nodes 24 are adjusted so that $VCN_1 = -V_{in} + \Delta$, $VCN_2 = -V_{in} + 2\Delta$ and, in general, $VCN_n = -V_{in} + n\Delta$. If $V_{in} = n\Delta$, then $VCN_n = 0$. Generally, $V_{in}$ is not a multiple of $\Delta$ but lies in the voltage interval between $V_n$ and $V_{n+1}$, where the magnitude of the voltage interval is $\Delta = V_R/8$.

Each comparator 32(j) generates a comparator output signal that is in either one of two binary states, labeled 1 and 0. The output state is a 1 when the voltage at the common node 24(j) is less than 0v and the output state is a 0 when the voltage at the common node 24(j) is greater than 0v. For the case where $V_{in}$ lies in the voltage interval defined by $V_n$ and $V_{n+1}$, the comparator output signals are 1 for j less than or equal to n and are 0 for j greater than n. Thus, the digits n and (n+1) identify transition point from the voltage on the common node 24(n) being less than 0v and the voltage on the common node 24(n+1) being greater than 0v. The logic and encoder network 40 generates a three-bit binary MSB signal encoding the digit n and identifying the voltage level wherein $V_{in}$ lies. This MSB signal is latched into the MSB latch 44.

The determination of the three LSBs of the digital representation of $V_{in}$ will now be described. During the MSB conversion, the sub interval between $V_n$ and $V_{n+1}$ in which $V_{in}$ lies has been determined. Assume, without loss of generality, that $V_{in} \leq V_R/2$. The switches $S_{(n)O}$ and $S_{(n+1)O}$ are closed so that the levels $V_{n+1}$ and $V_n$ are coupled to lines A′ and A, respectively, of buses 12(j). The selection of line A′ or A by a given digit switch 28 may be controlled via a single bit, $b_{ij}$, in the control code supplied to the switch 28, where i indicates the identity of the capacitor in the array 18(j), i.e., i=0 for $C_0$, i=1 for $C_1$, i=2 for $C_2$, and i=3 for scaling capacitor 22, and j indicates the parallel branch 18(j). If $b_{ij}=1$ then the opposite plate of the associated capacitor is coupled to line A′, $V_{n+1}$, by switch $S(28)_{ij}$ and if $\overline{b}_{ij}=1$, i.e., $b_{ij}=0$, the opposite plate of the capacitor is coupled to line A.

During the LSB conversion cycle the control bits, $b_{ij}$, for the digit switches are set to equal the binary code for the place of the array 18(j) is the ordered set of arrays. For example, for j=7, ($b_{07}$, $b_{17}$, $b_{27}$)=(1,1,1) so that all digit capacitor 22 opposite plates are coupled to line A′, $V_{n+1}$. For j=6, ($b_{06}$, $b_{16}$, $b_{26}$)=(1,1,0) so that the first and second digit capacitors $C_0$ and $C_1$ 22 are coupled to line A′, $V_{n+1R}$, and the third digit capacitor $C_2$ is coupled to line A, $V_n$.

The control bit $b_{3j}$ is set equal to zero for all js so that the scaling capacitor $C_3$ 22 is coupled to line A, $V_n$, in each parallel branch 18(j).

During the LSB conversion cycle, the voltage at the common node, $VCN_j$, at the jth node is determined by the following formula.

$$VCN_j = -V_{in} + V_{n+1}\left(\frac{b_2}{2} + \frac{b_1}{4} + \frac{b_0}{8}\right) + V_n\left(\frac{\overline{b}_2}{2} + \frac{\overline{b}_1}{4} + \frac{\overline{b}_0}{8} + \frac{1}{8}\right) \quad \text{(Eq. 1)}$$

where ($b_{2j}$, $b_{1j}$, $b_{0j}$ is the binary representation of j. Either $b_i=1$ or $\overline{b}_i=1$ for i=0, 1, 2.

The effect of setting the switches 28 in each array to the binary code for the place of the array is to adjust the voltages at the common nodes 24 by increasing each $VCN_j$ by the quantity $\Delta/8$ relative to $VCN_{j-1}$. Accordingly, the interval ($V_{n+1}$, $V_n$) is divided into seven sublevels spaced by $\Delta/8$ during the LSB cycle. This further partitioning of the voltage interval into voltage subintervals is depicted in FIG. 2.

As in the MSB case, the signal level $V_{in}$ lies in a voltage interval defined by voltage levels $V_n + m(\Delta/8)$ and $V_n + (m+1)(\Delta/8)$. Thus, during the LSB conversion cycle, $VCN_j$ is less than 0v for j less than or equal to m and is greater than 0v for j greater than m. The comparator output signal is 1 for j less than or equal to m and 0 for j greater than m. The logic and encoder network 40 generates a three-bit LSB signal which is latched into the LSB latch 46.

Accordingly, the six-bit digital representation of the sampled voltage, $V_{in}$, is generated in only two clock cycles, enabling the system to be utilized in systems requiring a very fast conversion rate.

The comparator offset compensation function of the system will now be described. As is well-known in the art, the comparators 32 may be MOS differential amplifiers. Ideally, for an input signal of 0v the output signal is also 0v. Practically, for an 0v input signal the output signal is equal to some offset voltage. B.

In the embodiment depicted in FIG. 1, the switches $S_1$ 36 and $S_2$ 38 are closed prior to sampling $V_{in}$. The offset capacitor, $C_O$ 34, is charged to a voltage of $B/(1+A)$ where A is the gain of the MOS amplifier. Switch $S_2$ 38 is then opened and an offset charge, $Q_O = -C_O \cdot B/(1+A)$, is stored on the plate of $C_O$ adjacent to the first input terminal of the comparator 32. This charge, $Q_O$, does not leak off $C_O$ 34 because of the high input impedance of the comparator 34.

Figure 3C:
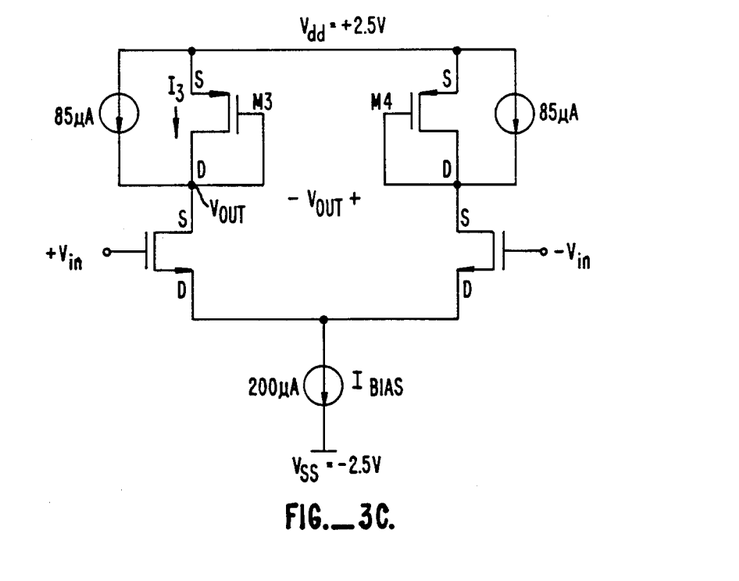
FIGS. 3C and 3D are schematic and circuit diagrams, respectively, of an improved comparator.
Figure 3D:
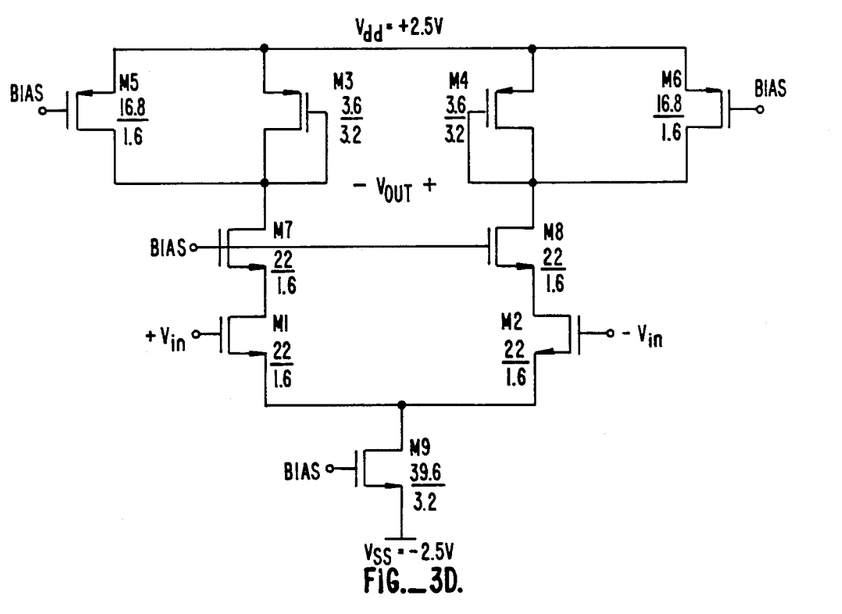

The preferred embodiment utilizes an improved comparator circuit. FIGS. 3C and 3D show a simplified schematic and circuit diagram of a fully differential comparator that does not need Common Mode Feedback (CMFB). Previous fully differential comparators have needed CMFB to stabilize their common-mode output voltage. In this new design, diode-connected MOS transistors, M3 and M4, are used as resistive loads, thus the common mode output voltage is set by the voltage drop from Vdd. This voltage drop is Ibias/2×R where R is the resistance of the diode-connected device.

When a voltage level is generated at the common node 24 during the conversion process, this stored offset charge, $Q_0$, alters the voltage level at the first comparator input terminal to cancel the effect of the offset voltage, B, at the comparator output terminal.

For example, assume that MSB code is (0,1,1), thus it has been determined that $V_{in}$ is the interval between $V_3 = 3\Delta$ and $V_4 = 4\Delta$. During the LSB conversion cycle, $V_1 = 3\Delta + \Delta/8$, $V_2 = 3\Delta + 2(\Delta/8)$, . . . $V_m = 3\Delta + m(\Delta/8)$. If $V_{in} = 3\Delta + 2.5(\Delta/8)$, then the LSB code would be (0,1,0). Therefore, the 6-bit code for $V_{in}$ is (0,1,1,0,1,0). Accordingly, the entire code is generated in two clock cycles.

If MSB code were (0,1,0) then $V_{in}$ is between $V_2 = 2\Delta$ and $V_3 = 3\Delta$. Note that for this interval, the lower voltage level, $V_2$, cannot be connected to line A. The controller supplies the complement of j value to the switches $28_{ij}$, i=0, −2, for this code and set $b_{3j}=1$ to coupled the scaling capacitors $C_3$ 22 to line A′. Thus, the correct LSB code is generated for this special case.

Several advantages accrue from the architecture depicted in FIG. 3. Because only alternate terminals, $V_j$, are coupled to each of the lines A, A′, B, or B′, the parasitic capacitance of the open switches is reduced. Further, because the voltage level inversion is compensated by complementing the coded signal, the requirement of a crossover switch between lines A and A′ or B and B′ is eliminated. The elimination of the cross-over switch reduces the resistance of the switching network. This reduction of parasitic capacitance and resistance increases the speed and performance of the SLGSN 10.

Figure 4:
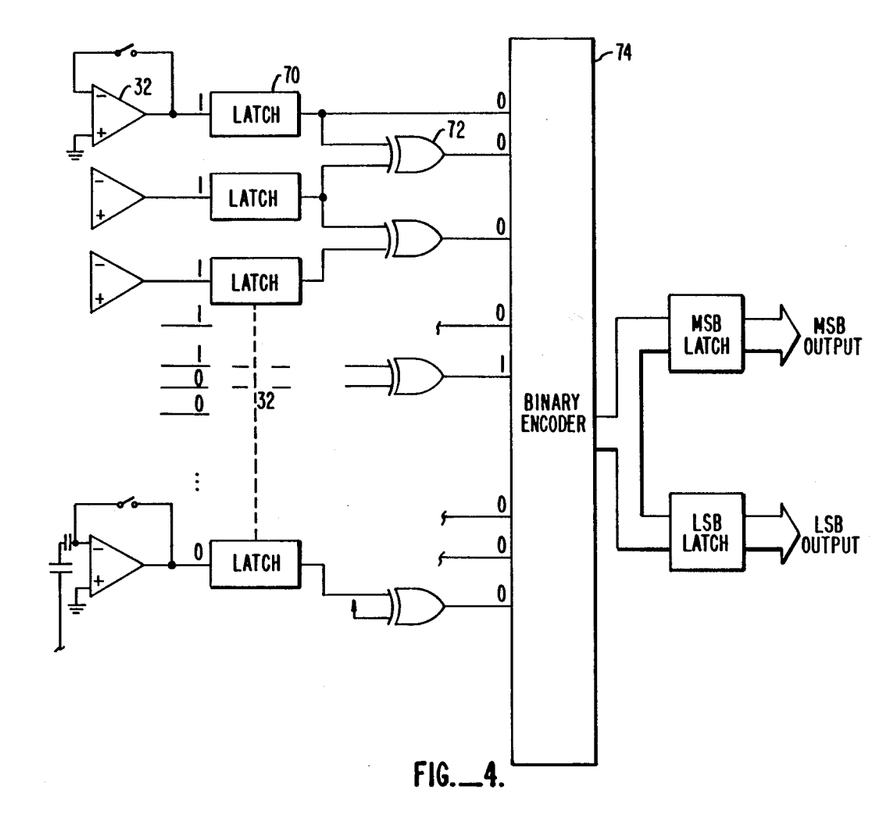
FIG. 4 is a schematic diagram of the logic and encoder network.

FIG. 4 is a schematic diagram of a logic and decoder network 40 utilized in a preferred embodiment of the invention. The outputs of the comparators 32 are latched into comparator latches 70. The outputs of these latches 70 are coupled to the inputs of exclusive-OR gates (XOR) 72. The output of the XOR gates 72 are coupled to the inputs of a binary encoder 74.

As described above, during the LSB conversion cycle, the outputs of all the comparators for j less than or equal to n are 0 and the outputs of all the comparators for j greater than n are 1. The outputs of the XOR gates 72 are 0 unless one input is a 1 and the other input is a 0. The outputs of the XOR gates are also shown on the diagram for the case illustrated. The binary encoder 74 may be a read only memory (ROM) programmed to generate a three-bit signal indicating the position of the 1 in the input address.

Figure 5A:
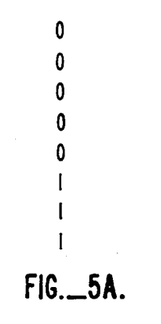
FIGS. 5A and 5B are schematic diagrams depicting the state of the comparator output signals.
Figure 5B:
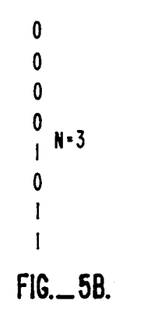

FIGS. 5A and 5B depict two possible outputs for the case n=3. FIG. 5A indicates the correct output of the comparators with comparator output equal to 1 for j less than or equal to 3 and equal to 0 otherwise. In FIG. 5B, the 1 and 0 for j=3 and 4 are reversed. This is a converter error and could occur, for example, if the common node voltage on the third capacitor array were very near to 0. For the logic and decode network 40 depicted in FIG. 4, the outputs of more than one of the XOR gates 72 would be 1 for the comparator output signals of FIG. 5B. As described above, the ROM 74 is programmed to receive only a single 1 in each possible address. Accordingly, the ROM 74 would not generate an output signal for the comparator output signals depicted in FIG. 5B.

Figure 6:
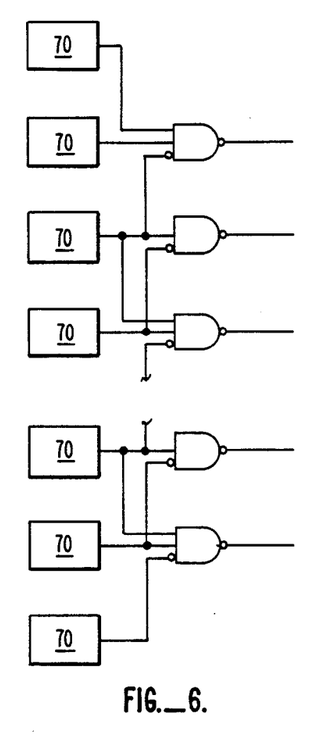
FIG. 6 is a schematic diagram of an alternate embodiment of the logic and encoder network.

FIG. 6 is an alternate embodiment of the invention that will present an address signal of the right format to the ROM 74. Referring to FIG. 6, the outputs of each three adjacent latches 72 are coupled to the first, second, and third input ports of NAND gates 76. The signal at the third input port of each NAND gate 76 is inverted. This logic network will generate only a single 1 for the type of comparator output signals depicted in FIG. 5B. The position of the 1 may be an error by one place, thereby causing a 1-bit error signal in the MSB or LSB output signal. However, the embodiment of FIG. 6 facilitates the operation of the converter in cases as depicted in FIG. 5B.

Figure 7:
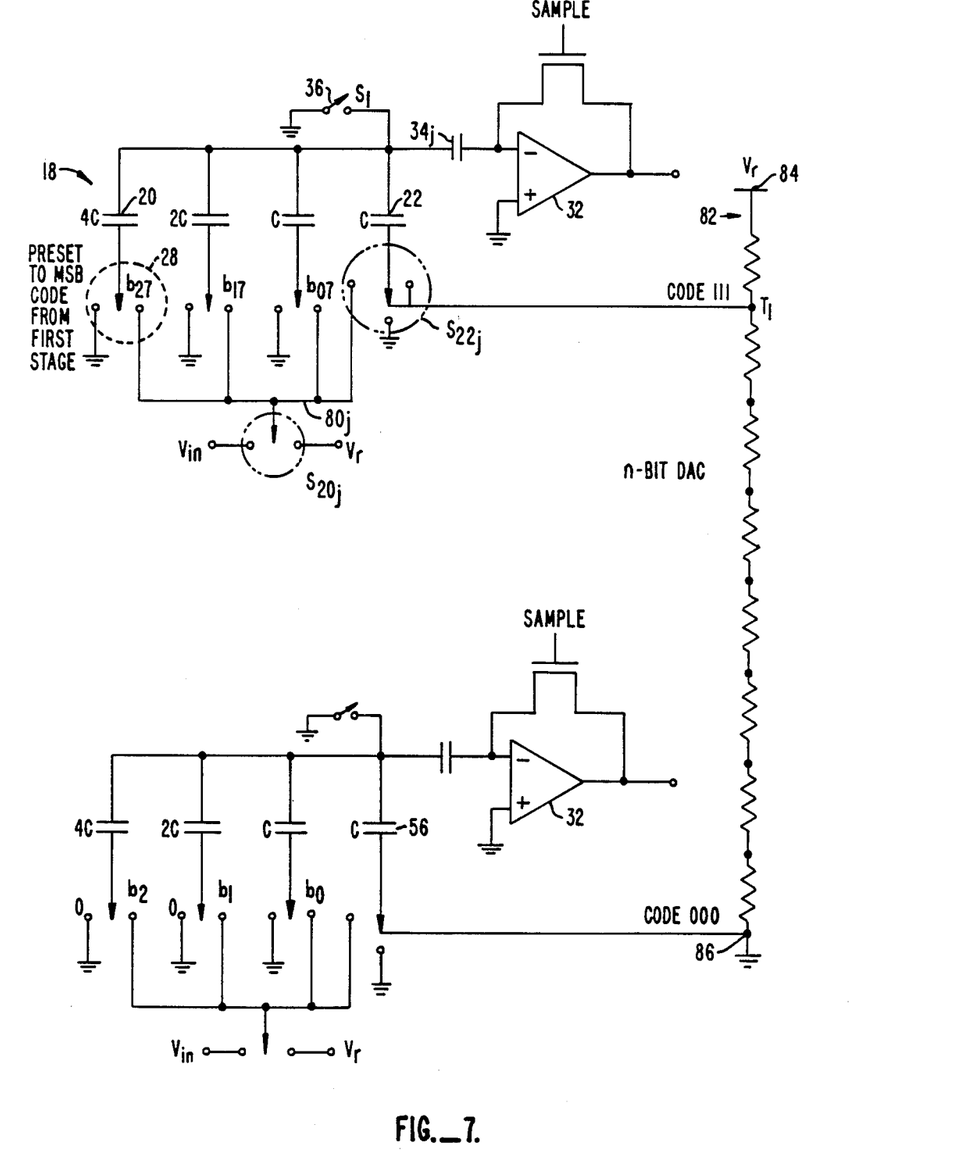
FIG. 7 is a schematic diagram of an alternate embodiment of the invention.

FIG. 7 depicts an alternative embodiment of the invention. Wherever possible, elements in FIG. 7 that are identical or corresponding to elements in FIG. 1 are labelled by the same reference numeral. Referring now to FIG. 7, each parallel branch $40(j)$, a signal line $80(j)$ is coupled to the second terminals of code switches 28. The first terminals of each code switch are coupled to ground. Each signal line $80(j)$ may be coupled to either $V_{in}$ or $V_R$ by switch $S_{20j}$. The scaling capacitor 22 has its opposite plate coupled to the first pole of switch $S_{22j}$. The second pole of switch $S_{22j}$ may be coupled to a first terminal connected to the signal line $86(j)$, a second terminal connected to ground, or a third terminal. A resistor string 82 has a first terminal 84 coupled to $V_R$ and a second terminal 86 connected to ground. The taps of the resistor string, $T_j$, are coupled to the third terminal of respective switches $S_{22j}$.

The operation of the embodiment depicted in FIG. 7 will now be described. During the sample and hold cycle, the switch bank $S_{20j}$ couples $V_{in}$ to the signal line $80_j$ and the digital control unit sets all $b_{ij}$ to 1 to couple the opposite plates of all the capacitors to $V_n$. Additionally, the switch bank $S_{22j}$ couples the opposite plate of the scaling capacitor 22 to the first terminal and the switch S1 is 36 closed. Accordingly, an initial charge equal to $-8CV_{in}$ is stored on the common plates of the capacitors in each capacitor array 18.

During the MSB conversion, the switch S1 36 is open and the second pole of switch $S_{22j}$ is coupled to ground. The digital control unit supplies a binary code to each capacitor array 18 encoding the place of the array in the ordered set of arrays. For example, the code (1,1,1) is supplied to the seventh capacitor array, and so on, as illustrated in the diagram. The voltages at the common node of each capacitor array will be as described in equation 1 with $V_{n+1}=V_r$ and $V_n=0$. The comparator output string will be an indication of the three MSBs of the digital representation of $V_n$.

Upon completion of the MSB determination, the digital code corresponding to MSBs is supplied by the digital control unit to each capacitor array $18j$. The second pole of the switches $S_{22j}$ are coupled to the third terminal to receive the voltage level corresponding to the corresponding tap, $T_j$, of the resistor string 82. The outputs of the comparators are then an indication of the three LSBs of the digital representation of $V_n$.

Alternatively, the embodiment depicted in FIG. 7 could be added on to the embodiment depicted in FIG. 1 to provide a third conversion stage. The determined LSB code is utilized to couple the opposite plates of digit capacitors 20 to either $V_R$ or $V_G$. Referring to FIG. 2, switch $37_j$ is set to couple $V_G$ to the $V_{in}$ line and $S_{100}$ (FIG. 3) couples line B' to $V_R$. Concurrently, the opposite plates of the scaling capacitors are coupled to the V(j) lines. Thus, a nine-bit digital representation of the $V_n$ is generated in 3 clock cycles from the embodiment utilizing eight capacitor arrays.

The invention has now been described with reference to specific embodiments. Various modifications and substitutions will be apparent to persons skilled in the relevant arts. For example, various combinations of switches could be utilized to achieve the results described. Accordingly, it is not intended that the invention be limited except as provided by the appended claims.

What is claimed is:

1. An ADC, having an ordered set of parallel branches that perform selected functions during a sequence of clock cycles, for generating a digital representation of an input voltage, $V_{in}$, the ADC comprising:

a capacitor array in each parallel branch, with each capacitor in an array having a common plate and an opposite plate, with the common plates of all the capacitors in each array coupled to a common node (CN) associated with the array;

means for charging the common nodes of each capacitor array to $-CV_{in}$, where C is a constant;

means for generating an ordered set of reference voltage levels separated by a selected voltage interval, to define an ordered set of voltage intervals;

means for coupling one of the reference voltage levels in said ordered set of reference voltage levels to the opposite plates of a corresponding one of said capacitor arrays, during a first clock cycle, thereby generating an ordered set of first CN voltage levels at the common nodes of said ordered set of capacitor arrays;

means for identifying an adjacent pair of capacitor arrays, coupled to a given pair of reference voltage levels defining a given reference voltage interval, having first CN voltage levels of opposite polarity with the place of the identified array pair in the ordered set of arrays being an indication of the digital representation of $V_{in}$ and of the given reference voltage interval wherein $V_{in}$ lies.

2. The invention of claim 1 further comprising:
means adapted to couple one of the reference voltage levels of said given pair of reference voltage levels to selected opposite plates of each capacitor array and the other reference voltage level of said given pair to the unselected opposite plates, during a second clock cycle, for generating an ordered set of second CN voltage levels, with the second CN voltage levels subdividing the given reference voltage interval defined by said given reference voltage levels into incremental sub-intervals and where the position of a capacitor array pair in said ordered set of capacitor arrays having second CN voltage levels of opposite polarity is a further indication of the digital representation of $V_{in}$ and of the given incremental subinterval wherein $V_{in}$ lies.

3. The invention of claim 2 wherein said means for generating said reference voltage levels comprises:
a voltage source having a $V_R$ terminal and a $V_g$ terminal;
a resistor string of N resistors connected in series between the $V_R$ and $V_G$ terminals, each resistor having two terminals with the terminals of said series connected resistors forming the output terminals $V_j$, $j=0, \ldots, N$, of said voltage generating means where $V_O = V_G$ and $V_N = V_R$; and wherein the capacitor array in each parallel branch comprises:
an ordered set of binary weighted capacitors, each capacitor identified by the term $C_{ij}$ where j indicates the place of the parallel branch and i indicates the binary power of the capacitor where the capacitive value of the capacitor identified by $C_{ij}$ is a constant multiplied by $2^i$.

4. The invention of claim 3 wherein said means for generating the second set of CN voltage levels comprises:
a first voltage level line;
a set of even switches for controllably coupling an even one of said terminals, $V_j$, j being an even integer, to said first voltage line;
a second voltage level line; and
a set of odd switches for controllably coupling an odd one of said terminals, $V_j$, j being an odd integer, to said second voltage level line.

5. The invention of claim 4 wherein said means for generating said second set of CN voltage levels further comprises:
means for controlling said odd and even switches to couple one of said given voltage levels to said first voltage line and the other of said given voltage levels to said second voltage line; and
a set of digit switches, each switch for coupling one of said binary capacitors to either said first or second voltage lines under control of a control bit $b_{ij}$, where capacitor $C_{ij}$ is coupled to said first voltage line if $b_{ij}$ is 0 and to said second voltage line if $b_{ij}$ is 1.

6. The invention of claim 5 wherein said means controlling said odd and even switches comprises:
means for generating ordered sets of control bits in the form of a binary code for each parallel branch, where the binary code provided to a given parallel branch encodes the place of the given parallel branch if the magnitude of the given voltage level coupled to said first voltage level line is greater than the magnitude of the voltage level coupled to said second voltage level line and the binary code provided to said given parallel branch is equal to the complement of the binary representation of the place of said given parallel branch when the magnitude of the given voltage level coupled to said first voltage line is less than the magnitude of the voltage level coupled to said second voltage line so that a crossover switch between the voltage lines is not required and output resistance is reduced.

7. The invention of claim 6 wherein said indication of the incremental sub-interval wherein $V_{in}$ lies in the form of a binary LSB code, said first voltage level line is coupled to $V_R$, and binary code provided is equal to said LSB code, and further comprising:
a scaling capacitor in each capacitor array having a common plate coupled to the CN of the array and having an opposite plate;
a third voltage level line coupled to $V_G$;
means for coupling capacitor $C_{ij}$ to said first voltage line if $b_{ij}$ is 1 and to said third voltage line if $b_{ij}$ is 0; and
means for coupling the opposite plates of said scaling capacitors to respective ones of the output terminal of said voltage generating means to further subdivide said incremental sub-intervals.

8. The invention of claim 2 wherein means for identifying comprises:
a comparator circuit in each parallel branch, having a first input port coupled to the common node of the parallel branch, a second input port coupled to $V_G$ and having an output port, for generating a comparator output signal at said output port in a first binary state if CN voltage level is greater than $V_G$ and in a second binary state if the CN voltage level is less than $V_G$; and
an encoder, adapted to receive said comparator output signals, for indicating the position of a pair of comparator output signals having opposite polarity.

9. The invention of claims 8 further comprising:
an offset capacitor coupled between the first input terminal of a given comparator and the common node of the associated capacitor array; and
means for selective coupling the output terminal of the given comparator to its first input terminal.

10. The invention of claim 9 wherein said encoder comprises:
a set of exclusive OR gates having input ports coupled to the output ports of adjacent comparators.

11. The invention of claim 9 wherein said encoder comprises:
a set of NAND gates, each having a first, second, and third input port, with the third input port being an inverting port, and having said input ports coupled to respective output ports of three adjacent comparators.

* * * * *